United States Patent
Yu et al.

(10) Patent No.: US 10,163,500 B1
(45) Date of Patent: Dec. 25, 2018

(54) SENSE MATCHING FOR HARD AND SOFT MEMORY READS

(71) Applicant: Intel Corporation, Santa Clara, CA (US)

(72) Inventors: Erwin E. Yu, San Jose, CA (US); William C. Filipiak, Boise, ID (US); Dheeraj Srinivasan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,774

(22) Filed: Sep. 30, 2017

(51) Int. Cl.
*G11C 11/56* (2006.01)
*G11C 16/04* (2006.01)
*G11C 16/26* (2006.01)
*G06F 11/10* (2006.01)

(52) U.S. Cl.
CPC ...... *G11C 11/5642* (2013.01); *G06F 11/1072* (2013.01); *G11C 16/0483* (2013.01); *G11C 16/26* (2013.01)

(58) Field of Classification Search
CPC .................................................. G06F 11/1012
USPC ...................................................... 365/185.03
See application file for complete search history.

(56) References Cited

U.S. PATENT DOCUMENTS

| | | | |
|---|---|---|---|
| 8,397,150 B1 * | 3/2013 | Nieminen | H03M 13/4107 375/262 |
| 9,495,518 B2 * | 11/2016 | Kim | G06F 21/00 |
| 9,633,744 B2 | 4/2017 | Kavalipurapu et al. | |
| 2011/0273935 A1 * | 11/2011 | Dong | G11C 11/5642 365/185.22 |
| 2014/0119114 A1 * | 5/2014 | Motwani | G11C 16/26 365/185.03 |
| 2015/0149818 A1 * | 5/2015 | Kalavade | G06F 11/073 714/6.13 |
| 2015/0293810 A1 * | 10/2015 | Ramaraju | G06F 11/1064 714/819 |
| 2017/0084347 A1 | 3/2017 | Kavalipurapu et al. | |
| 2017/0186500 A1 * | 6/2017 | Motwani | G11C 29/44 |
| 2017/0242748 A1 * | 8/2017 | Lin | G06F 11/1068 |

OTHER PUBLICATIONS

Cai et al.; "Threshold Voltage Distribution in MLC NAND Flash Memory: Characterization, Analysis, and Modeling"; Design, Automation & Test in Europe Conference & Exhibition (DATE); (2013); pp. 1-6; <doi: 10.7873/date.2013.266 >.

(Continued)

*Primary Examiner* — Min Huang
(74) *Attorney, Agent, or Firm* — Thorpe North & Western, LLP; David W. Osborne

(57) ABSTRACT

Error correction systems and methods for improving sense matching conditions between hard-bit read (HBR) information and soft-bit read (SBR) information. For HBRs, a given set of sense conditions can include a discharged bit line of one or more cells that discharged during a previous HBR. For SBRs, a given set of sense conditions can include loading latches of the sense amplifiers for corresponding cells are with sense results of the previous SBR strobe when the corresponding cells discharged during a previous SBR strobe or loading the latches of the sense amplifiers with sense results of a previous HBR when the corresponding cells discharged during the previous HBR.

27 Claims, 7 Drawing Sheets

(56) References Cited

OTHER PUBLICATIONS

Haratsch; "NAND Flash Media Management Algorithms"; In: Flash Memory Summit 2016, Seagate; (2016); 23 pages; Santa Clara, CA.

Hawes; "How Micron FortisFlash Technology improves Performance and Endurance"; A Micron Technical Marketing Brief; (Feb. 2015); pp. 1-4; Micron Technology Inc.

Johnson; "Introducing Low-Density Parity-Check Codes"; The University of Newcastle Australia; (2008); 83 pages; School of Electrical Engineering and Computer Science.

Kim et al.; "Low-energy error correction of NAND Flash memory through soft-decision decoding"; EURASIP Journal on Advances in Signal Processing 2012; (2012); 12 pages; <doi: 10.1186/1687-6180-2012-195 >.

Micron Technology; "NAND Flash 101: An Introduction to NAND Flash and How to Design It in to Your Next Product"; Technical Note; (Apr. 2010); 27 pages; TN-29-19; Micron Technology Inc.

Motwani et al.; "Low Density Parity Check (LDPC) Codes and the Need for Stronger ECC"; Intel Corporation; (Aug. 2011); 18 pages.

Novotny et al.; "NAND Flash Memory Organization and Operations"; Journal of information Technology & Software Engineering; (Jan. 30, 2015); 8 pages; vol. 5, Issue 139; <doi: 10.4172/2165-7866.1000139 >.

Regulapati; "Error Correction Codes in NAND Flash Memory"; The University of Texas at Austin; (Dec. 2015); 66 pages; Master of Science in Engineering.

\* cited by examiner

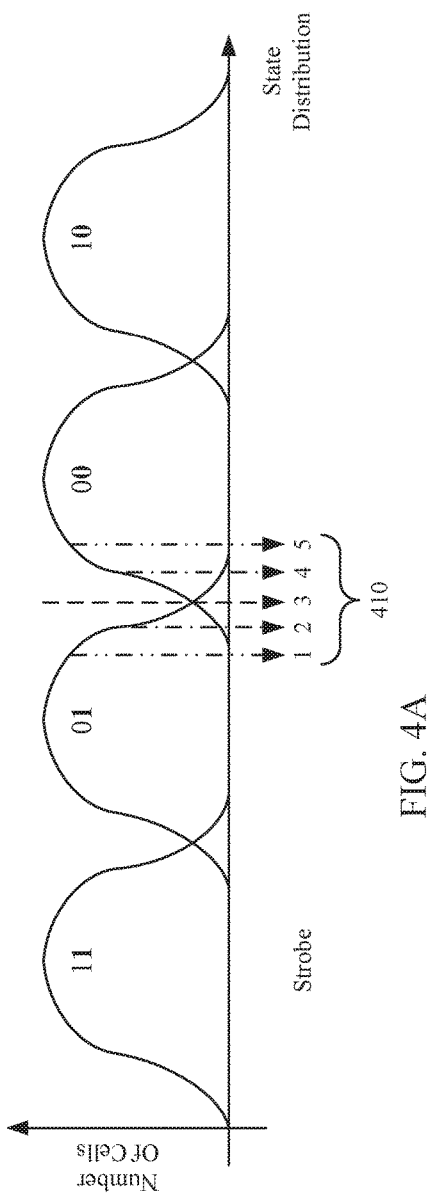
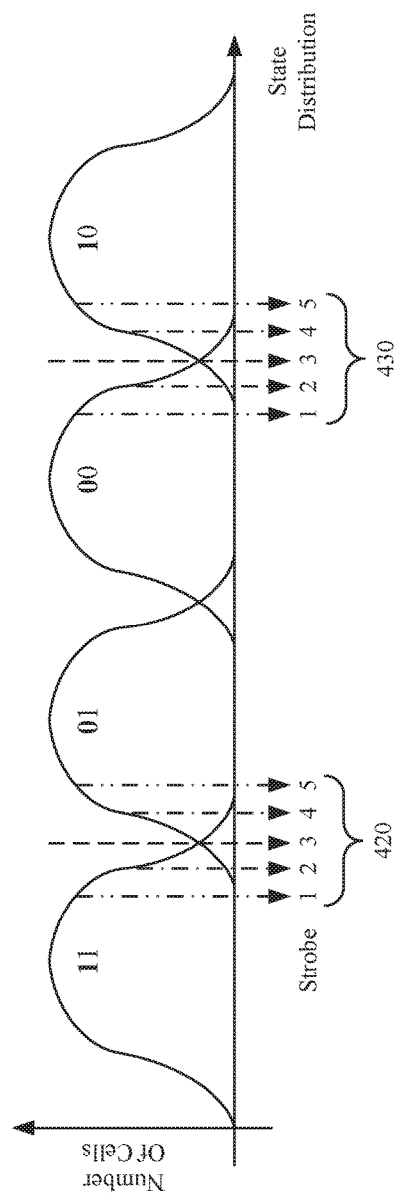
FIG. 4A
FIG. 4B

SENSE MATCHING FOR HARD AND SOFT MEMORY READS

BACKGROUND

In memory devices, each memory cell can store one or more bits of data. A memory cell with two states can store one bit of data per cell, and is referred to as a Single-Level Cell (SLC). A memory cell with four states can store two bits of data per cell, and is referred to as a Multi-Level Cell (MLC). A memory cell with eight states can store three bits of data per cell, and can also be referred to as a MLC or as a Triple-Level Cell (TLC). A memory cell with sixteen states can store four bits of data per cell, and can also be referred to as a MLC or as a Quad-Level Cell (QLC). The MLC memory is advantageous for high device integration. However, as the number of bits programmed in each memory cell increases, the read, write and erase failure rates typically increase.

MLC utilize error correction algorithms to detect and correct errors that occur during operation. Errors can be caused by a number of sources, such as random noise, cell-to-cell interference, read or write disturb, programming error, retention errors, charge leakage and trapping generation. As memory devices continue to be scaled and/or the number of bits stored per cell increases, the error rate tends to increase. Accordingly, there is a continuing need for improved error correction algorithms for use with memory devices.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIGS. 4A and 4B are a diagram illustrating Soft-Bit Read (SBR) operations for the exemplary 2-bit MLC;

DESCRIPTION OF EMBODIMENTS

Figure 1:
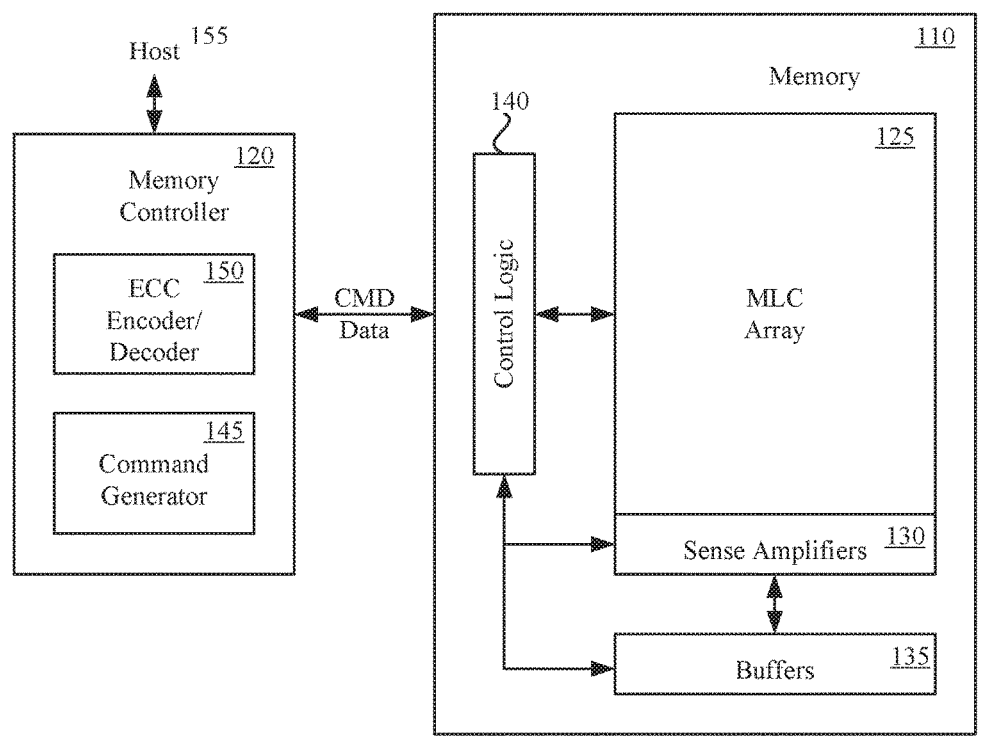
FIG. 1 is a diagram illustrating a memory and memory controller in accordance with an example embodiment.

Before technology embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a layer" includes express support for a plurality of such layers.

Reference throughout this specification to "an example" means that a particular feature, structure, or characteristic described in connection with the example is included in at least one invention embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "minimized," "reduced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as central processing units (CPUs), graphics processing units (GPUs), digital signal processors (DSPs), microcontrollers (MCUs), embedded controller (ECs), field programmable gate arrays (FPGAs), or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Error correction codes (ECC) are an integral part of conventional memory devices. ECC techniques can be used to correct bit errors typically introduced when reading or writing to memory. ECC encoding techniques are used to add redundancy to the data bits to form a codeword for storage in the memory devices. ECC decoding techniques use the codeword to detect and correct errors therein.

ECC decoding techniques can use hard bit information and soft bit information about the codeword to detect and correct errors in the codeword for decoding user data from the codeword. However, difference in bit error rates between the hard bit information and the soft bit information used to decode user data from the codeword can deleteriously affect the error correction rate of the ECC decoding algorithm.

In one aspect, a memory system can include a memory controller and one or more memory devices. The memory devices can include a Multi-Level Cell (MLC) array, a plurality of sense amplifiers, a plurality of buffers and control logic. The control logic can be configured to receive a hard-bit sense command. In response to the hard-bit sense command, the control logic can be configured to control a plurality of sense amplifiers to sense cells of a given word line using a given set of sense conditions for a current one of a plurality of Hard-Bit Reads (HBR). If one or more cells discharged during a previous HBR, the given sense conditions for the current HBR can include a discharged bit line for the one or more corresponding cells. Configuring the cells that discharged during the previous HBR with discharged bit lines for sensing during the current HBR advantageously provides a quieter environment when sensing on the current HBR. The control logic can also be configured to control a plurality of buffers to store sense results for the current HBR, and to determine if one or more of the cells of the given word line discharged during the current HBR. The control logic can also be configured to determine hard-bit information from the sense results of the plurality of HBRs.

The control logic can also be configured to receive a soft-bit sense command. In response to the soft-bit sense command, the control logic can be configured to control the plurality of sense amplifiers to sense the cells of the given word line using the given set of sense conditions for a current one of a plurality of Soft-bit Read (SBR) strobes. The given set of sense conditions can include loading the latches of the sense amplifiers for corresponding cells that discharged during a previous SBR strobe with the sense results of the previous SBR strobe. The set of sense conditions can also include loading the latches of the sense amplifiers for the corresponding cells that discharged during a previous HBR with the sense result of a previous HBR. Loading the latches with the sense results of the previous HBR for cells that discharged during the previous HBR advantageously improves that matching of sense conditions between the HBRs and SBRs. In addition, loading the latches with the sense results of the previous SBR for cells that discharged during the previous SBR advantageously knocks out the chance of detecting a discharged cell during one SBR strobe and then detecting that the cell did not discharge during a subsequent SBR strobe. The control logic can also be configured to control the plurality of buffers to store sense results for the current SBR strobe, and to determine if one or more of the cells of the given word line discharged for the current SBR strobe. The control logic can also be configured to determine soft-bit information from the sense results for the plurality of SBR strobes.

An ECC decoder of the memory controller can be configured to receive the hard-bit information and the soft-bit information from the memory device. The ECC decoder can be configured to detect and correct errors using the hard-bit information to determine corrected read data, and detect and correct errors using the soft-bit information when one or more errors are not corrected using the hard-bit information to determine the corrected read data. The memory controller can output the corrected read data to a host device or can output a read fail indication if one or more detected errors cannot be corrected.

FIG. 1 is a diagram illustrating a memory system in accordance with an example embodiment. The memory system can include one or more memory devices 110 and a memory controller 120. Each memory device 110 can include one or more MLC arrays 125, a plurality of sense amplifiers 130, a plurality of buffers 135 and control logic 140. The memory device 110 typically includes other sub-circuits that are not necessary for an understanding of the present technology and therefore are not discussed herein. The memory controller 120 can include a command generator 145 and an ECC encoder/decoder 150. The memory controller 120 also typically includes other sub-circuits that are not necessary for an understanding of the present technology and therefore are not discussed herein.

The one or more MLC arrays 125 can store two or more bits of data per memory cell. As used herein the term MLC is used to refer to memory cells that can each store 2 bits of data, that can each store 3 bits of data (also referred to as a Triple-Level Cell (TLC)), that can each store 4 bits of data (also referred to as a Quad-Level Cell (QLC)), and more. In one instance, the MLC array may utilize floating gate transistor (FGT) storage cells connected in series with adjacent storage cells sharing source and drain regions.

The command generator 145 can receive read and write requests from a host device or system 155. In response to the received write requests, the command generator 145 can generate corresponding write commands, and if applicable corresponding erase commands. Along with the write commands, the ECC encoder/decoder 150 can encode user data with an error correcting code as a codeword that is stored in the memory 110. In response to read requests, the command generator 145 can generate corresponding read commands for controlling operation of the memory 110. The ECC encoder/decoder 145 receives codeword information from the memory 110 in response to the read commands, and decodes the user data from the received codeword information.

Figure 2:
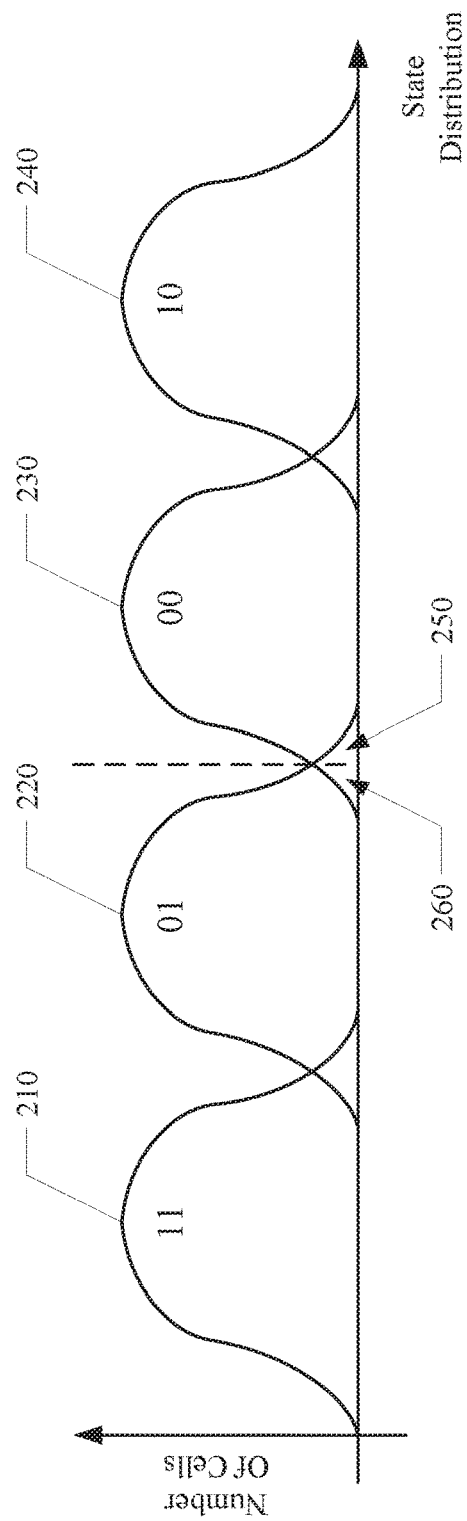
FIG. 2 is a diagram illustrating the memory state distribution of an exemplary 2-bit Multi-Level Cell (MLC)

FIG. 2 is a diagram illustrating the memory state distribution of an exemplary 2-bit MLC. The 2-bits of data can be represented by four different voltage potentials stored on the floating gate of the cell. For example, a 2-bit MLC may have a first threshold voltage distribution corresponding to a first state 210 (e.g., bit values '11'), a second threshold voltage distribution corresponding to a second state 220 (e.g., bit values '01'), a third threshold voltage distribution corresponding to a third state 230 (e.g., bit values '00'), and a fourth threshold voltage distribution corresponding to a fourth state 240 (e.g., bit values '10'). Similarly, data can be represented by eight different voltage potentials in a 3-bit MLC. In a 4-bit MLC the data can be represented by sixteen different voltage potentials stored on the floating gate of the cell.

Due to small differences between the electrical characteristics of memory cells in a device, each memory state of the cells can be characterized by a range of threshold voltage values at which the cells switch from a non-conducting state to a conducting state. While the distribution of each memory state may not overlap in a new memory device, after a number of erase and programming cycles the distribution of the different memory states may tend to overlap with adjacent memory states because of a number of effects, including charge loss, program disturbance, erase disturbance, back pattern dependency, and the like. The overlap of memory states can result in read data errors. For example, a number of cells 250 in a second state 220 may be erroneously determined by a read operation to be in a third state 230. Similarly, a number of cells 260 in the third state 230 may be erroneously determined by the read operation to be in the second state 220. ECC techniques can be used to detect and correct errors from hard-bit read information. In the event that all read errors cannot be corrected using the hard-bit read information, soft-bit read information can be used to improve the correction of read errors.

Figure 3A:
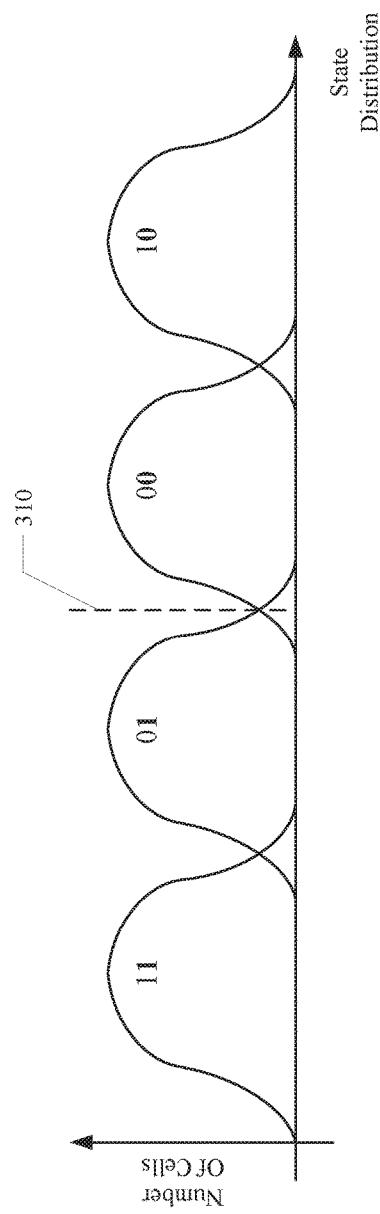
FIGS. 3A and 3B are a diagram illustrating Hard-Bit Read (HBR) operations for the exemplary 2-bit MLC.
Figure 3B:
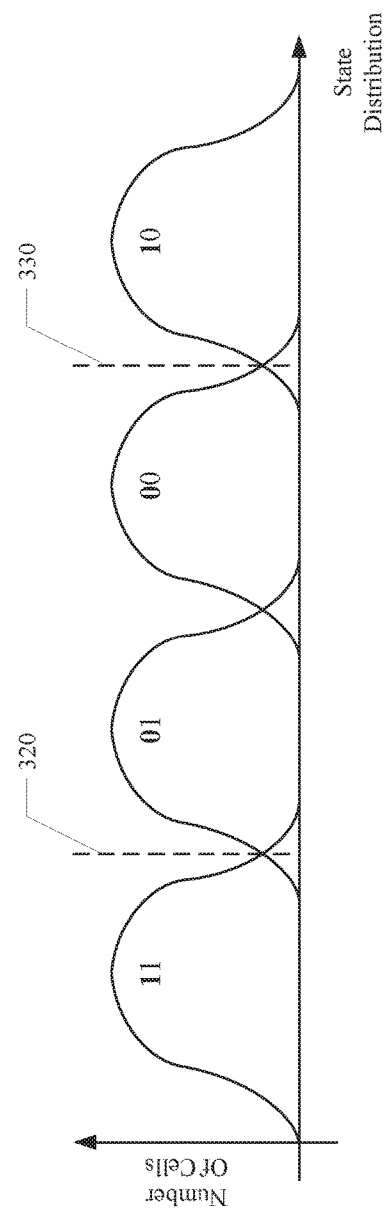

FIGS. 3A and 3B are a diagram illustrating HBR operations for the exemplary 2-bit MLC. For HBR, the state of a memory cell can be read by sensing at a plurality of HBR levels. In one aspect, hard-bit information for a Least Significant Bit (LSB) can be determined based upon one HBR level 310, as illustrated in FIG. 3A. Hard-bit information for a Most Significant Bit (MSB) can be determined based on two HBR levels 320, 330, as illustrated in FIG. 3B. Accordingly, three HBR levels 310, 320, 330 are used to resolve the four memory state distributions. The first HBR level 320 resolves the boundary between symbols 11 and 01, the second HBR level 310 resolves the boundary between symbols 01 and 00, and the third HBR level 330 resolves the boundary between symbols 00 and 10. Because a pair of LSB and MSB pages are mapped onto a word line and the bits are gray coded, the first and third HBR levels 320, 330 are utilized to read MSB pages, while the second HBR level 310 is utilized for LSB pages.

In response to a HBR command, the state of the cells for a given word line can be determined using a given set of sense conditions. The given set of sense conditions can include the charge on the bit lines and the state of the sense amplifiers. For a LBR page request to a 2-bit MLC, the bit lines of the memory array can be pre-charged for the second HBR, except for those cells that discharged during the first HBR, and a second read voltage level 310 can then be applied to the given word line. If the threshold voltage of the cell is less than the second read voltage level 310 the cell will conduct, discharging the corresponding bit lines (e.g., logic 1). If the threshold voltage of the cell is greater than the second read voltage level 310 the cell will not conduct (e.g., logic 0). For a MSB page request, the bit lines of the memory array can be pre-charged for the first HBR, and then a first read voltage level 320 can be applied to a given word line. If the threshold voltage of the cell is less than the first read voltage level 320 the cell will conduct, discharging the corresponding bit line (e.g., logic 1). If the threshold voltage of the cell is greater than the first read voltage level 320 the cell will not conduct (e.g., logic 0). Thereafter, the bit lines of the array can be pre-charged, except for those cells that discharged during the third HBR, and a third read voltage level 330 can be applied to a word line of the memory cell array. If the threshold voltage of the cell is less than the third read voltage level 330 the cell will conduct, discharging the corresponding bit lines (e.g., logic 1). If the threshold voltage of the cell is greater than the third read voltage level 330 the cell will not conduct (e.g., logic 0).

In another example, a 3-bit MLC (e.g., TLC) can utilize 7 HBR levels to resolve the 8 states. In one instance, the $1^{st}$, $3^{rd}$, $5^{th}$ and $7^{th}$ HBR levels can be utilized to read the MSB page. The $2^{nd}$ and $6^{th}$ HBR levels can be utilized to read the middle significant bit page. The $4^{th}$ HBR level can be utilized to read the LSB page. The bit lines, with the exception of those that discharged during a previous HBR, can be pre-charged and then a corresponding read voltage level can be applied for sensing. There are a number of other gray coding schemes for TLC, QLC and the like memory devices. Accordingly, different combinations of HBR levels can be utilized to resolve the different bit states depending upon the gray coding scheme utilized.

From the above examples, the bit lines of the cells that have not previously discharged are pre-charged before each sense for the second and subsequent HBRs. However, to prevent a case where a cell that has discharged during a previous read level from not also appearing discharged in subsequent read levels as a result of one or more read noise mechanism, the one or more cells for a current HBR can be configured with discharged bit-lines if the corresponding cells discharged during a previous HBR. In addition, knocking out cells that discharged on a previous HBR can provide a quieter environment for sensing during the current HBR. For instance, cells that discharged with a lower word line voltage at a previous HBR will draw more current on subsequent HBRs with the associated higher word line voltages.

FIGS. 4A and 4B are a diagram illustrating SBR operations for the exemplary 2-bit MLC. For SBR, the state of a memory cell can be read by sensing at a plurality of read strobes corresponding to the HBR levels. In one aspect, soft-bit information for the LSB can be determined based upon a one set of read strobes about one HBR level, as illustrated in FIG. 4A. Soft-bit information for the MSB can be determined based on two sets of read strobes 420, 430 about two HBR levels, as illustrated in FIG. 4B. The number of strobe in the sets of SBR strobes 410, 420, 430 can be 3, 5, 7 or more SBR strobes. Accordingly, three sets of SBR strobes can be used to resolve the four memory state distributions. A first set of SBR strobes 410, corresponding to the first HBR level 320, resolves the boundary between symbols 11 and 01. A second set of SBR strobes 420, corresponding to the second HBR level 310, resolves the boundary between symbols 01 and 00. A third set of SBR strobes 430, corresponding to the third HBR level 330, resolves the boundary between symbols 00 and 10.

In response to a SBR command, the state of the cells for a given word line can be determined using a given set of sense conditions. The given sense conditions can include the charge on the bit line and the state of the sense amplifiers. For the first SBR, the bit lines of the memory array can be pre-charged, and then a first read strobe voltage for the first corresponding HBR level can be applied to a given word line. If the threshold voltage of the cell is less than the first read strobe voltage for the first SBR the cell will conduct, discharging the corresponding bit line (e.g., logic 1). If the threshold voltage of the cell is greater than the first read strobe voltage the cell will not conduct (e.g., logic 0). For the second SBR, the bit line of the array can be pre-charged and a second read strobe voltage can then be applied to the given word line. If the threshold voltage of the cell is less than the second read strobe the cell will conduct, discharging the corresponding bit lines (e.g., logic 1). If the threshold voltage of the cell is greater than the second read strobe 310 the cell will not conduct (e.g., logic 0). The process is repeated for the other strobes in the first set of SBR strobes corresponding to the first HBR level, and for the strobes in the other corresponding HBR levels. For the current SBR strobe it can be determined if corresponding cells were discharged in the previous SBR strobe. For the cells that were discharged in the previous SBR strobe, the corresponding sense amplifier latch can be loaded with the state from the previous SBR strobe. In one instance, the state of the sense amplifier of the previous sense can be stored in a first buffer. When the cell discharged in the previous SBR strobe, the state of the sense amplifier of the previous sense can be loaded from the first buffer into the sense amplifier latch before the current SBR sense. In addition, for the current SBR strobe it can be determined if the corresponding cell was discharged in the corresponding previous HBR level. For cells that were discharged in the previous HBR level, the corresponding sense amplifier latch can be loaded with the state from the previous HBR level. In one instance, the state of the sense amplifier in the corresponding previous HBR sense can be stored in a second buffer. When the cell discharged in the corresponding previous HBR level, the state of the sense amplifier of the previous HBR sense can be loaded from the second buffer into the sense amplifier latch before the current SBR sense. In such cases the sense conditions for a current SBR substantially match the sense conditions for the corresponding HBR. In addition, cases where a cell that discharged during a previous read level can be prevented from appearing as not discharged in subsequent read levels.

Figure 5A:
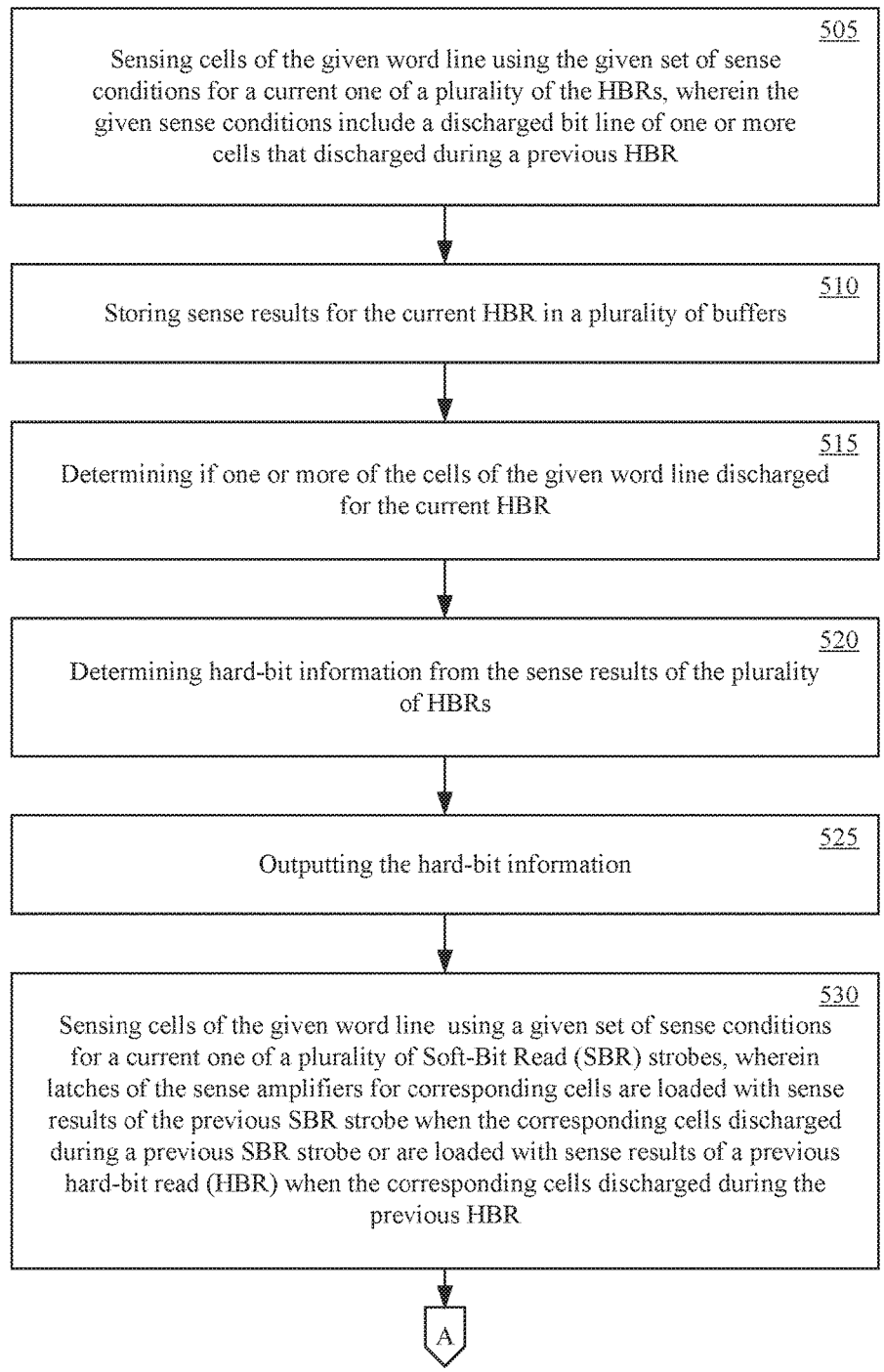
FIGS. 5A and 5B are a diagram illustrating a method reading codeword information in accordance with an example embodiment.
Figure 5B:
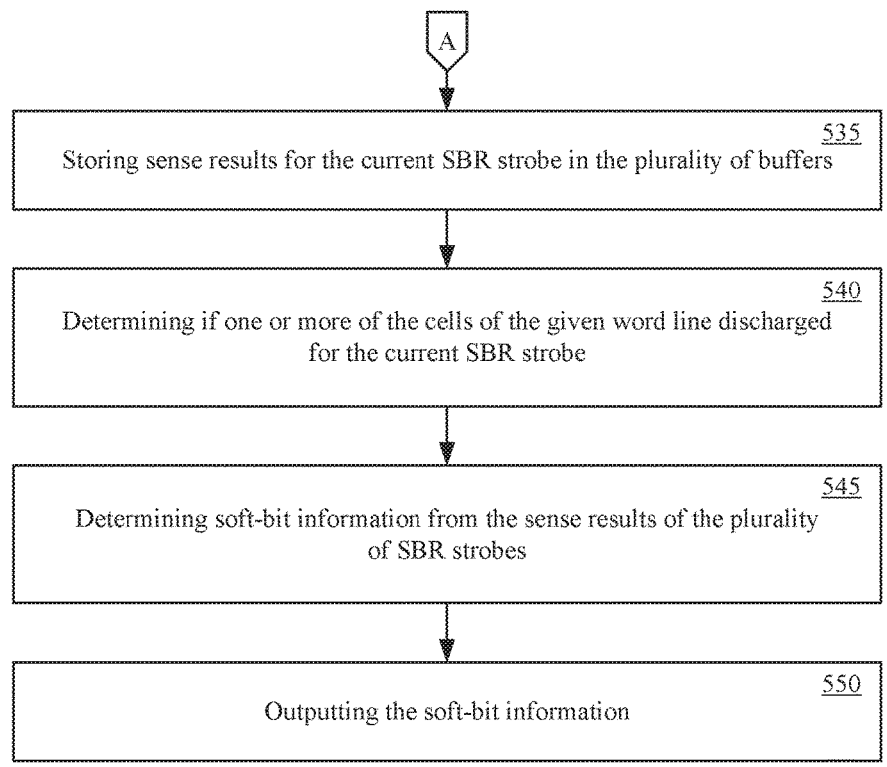

FIGS. 5A and 5B are a diagram illustrating a method of reading codeword information in accordance with an example embodiment. Reading codeword information in a MLC array can include receiving a hard-bit sense command 505. In one instance, a command generator 145 of the memory controller 120 can generate the hard-bit sense command in response to a read request received from a host device or system 155.

In one aspect, the cells of a given word line can be sensed using a given set of sense conditions for a current one of a plurality of HBR 510. When bit lines of the corresponding cells did not discharge during a previous HBR, the given sense conditions include charging the bit line of the corresponding cell in the current HBR. However, when corresponding cells discharge during the previous HBR, the given sense conditions include a discharged bit line of the one or more cells that discharged during the previous HBR.

In one aspect, the sense results for the current HBR can be stored 515. In one instance, the sense results for the current HBR can be stored in a first buffer 135 by the control logic 140. In one aspect, a determination can be made as to whether one or more cells of the given word line discharged for the current HBR 520. In one instance, the control logic 140 can determine which cells discharged for the current HBR. In one aspect, the cell sensing, storing the result of the sense and determining which cells discharged is iteratively repeated for the plurality of HBRs. In one instance, the HBRs include $2^n-1$ HBR levels for an n-bit MLC array. In one aspect, hard-bit information can be determined from the sense result of the plurality of HBRs 525. In one aspect, the control logic 140 can determine the hard-bit information after the plurality of HBR operations.

In one aspect, a soft-bit sense command can be received 530. In one instance, a command generator 145 of the memory controller 120 can generate the soft-bit sense command. In one aspect, the cells of the given word line are sensed using the given set of sense conditions for a current one of a plurality of SBR strobes 535. When bit lines of the corresponding cells did not discharge during a previous SBR, the given sense conditions include charging the bit line of the corresponding cell in the current SBR. However, when corresponding cells are discharge during a previous SBR strobe, the given sense conditions include loading the sense amplifiers 130 for corresponding cells with sense results of the previous SBR strobe. In addition, when the corresponding cells discharged during the previous HBR, the given sense conditions include loading the sense amplifiers for corresponding cells with the results of a previous HBR.

In one aspect, sensing the cells of the given word line using the given sense conditions can include saving a state of the sense amplifiers 130 from the previous SBR strobe. The sense amplifiers 130 can then be reset and the bit lines pre-charged for the current SBR strobe. After the bit line are pre-charged, a corresponding SBR strobe voltage can be apply to the given word line. The bit lines can then be sensed by the sense amplifiers 130 for the current SBR strobe. A state of one or more of the sense amplifiers can be restored with a corresponding state from a previous SBR strobe when corresponding cells discharged during the previous SBR strobe. The state of one or more of the sense amplifiers 130 can also be restored with the corresponding state from a previous HBR if corresponding cells discharged during the previous HBR.

In one aspect, the sense results for the current SBR strobe can be stored 540. In one instance, the sense results for the current SBR strobe can be stored in a second buffer 135 by the control logic 140. In one aspect, a determination can be made as to whether one or more cells of the given word line discharged for the current SBR strobe 545. In one instance, the control logic 140 can determine which cells discharged for the current SBR strobe. In one aspect, sensing the cell, storing the result of the sensing, and determining which cells discharged is iteratively repeated for the plurality of SBR strobes. In one instance, the plurality of SBR strobes can include 3, 5 or 7 SBR strobes for corresponding HBR levels. In one aspect, soft-bit information can be determined from the sense result of the plurality of SBR strobes 550. In one aspect, the control logic 140 can determine the soft-bit information after the plurality of SBR strove operations. In one aspect, the soft-bit information can be determined from the Boolean Exclusive-ORing predetermined sets of the plurality of SBR read strobe for the SBR strobes for the plurality of HBRs.

Figure 6:
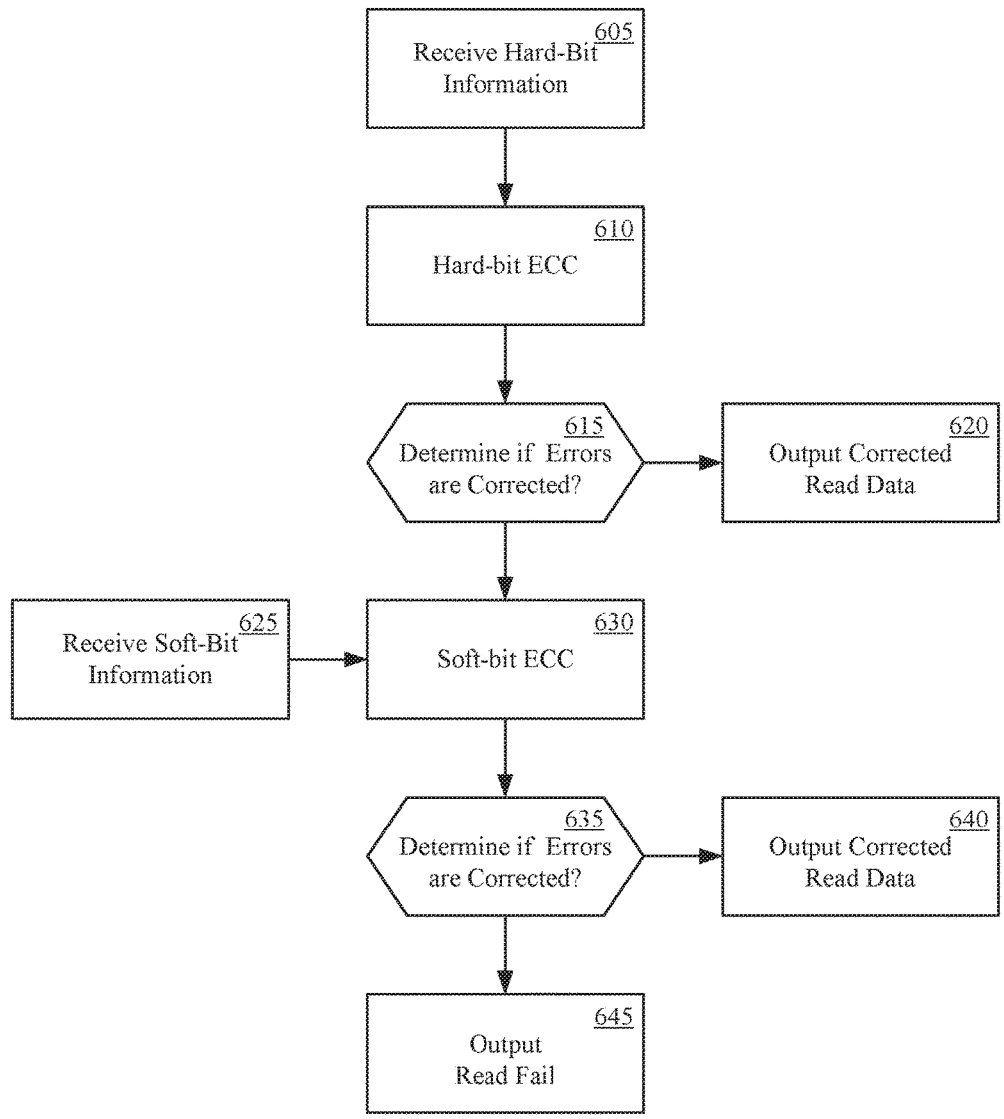
FIG. 6 is a diagram illustrating an error correction process in accordance with an example embodiment.

FIG. 6 is a diagram illustrating an error correction process in accordance with an example. In one aspect, the error correction process can decode hard-bit information and if needed soft-bit information to generate decoded data. In one aspect, the method can include receiving hard bit information of a codeword 605. In one instance, the hard bit information can be received by a memory controller 120 from a memory device 110.

In one aspect, the hard bit information can be decoded by a hard-bit Error Correcting Code (ECC) algorithm 610. In one instance, the hard-bit information can be decoded using a Low-Density Parity Code (LDPC) algorithm, a Bose, Chaudhuri, and Hocquenghem (BCH) algorithm, a Reed-Solomon algorithm, or the like. In one aspect, it is determined if the errors in the codeword for the hard-bit information have been corrected by the hard bit ECC algorithm 615. If the hard-bit information of the codeword has been decoded and the errors in the hard-bit information of a codeword have been corrected, the corrected read data can be output 620.

If the hard bit ECC algorithm cannot correct one or more errors in the hard-bit information of the codeword, the soft-bit information of the codeword can be received 625. In one instance, the soft-bit information can be received by the memory controller 120 from the memory 110. In one aspect, the soft-bit information of the codeword can be further decoded by a soft bit ECC algorithm 630. In one aspect, it is determined if the errors in the codeword for soft-bit information have been corrected by the soft bit ECC algorithm 635. If the codeword has been decoded and the errors in codeword have been corrected, the corrected read data can be output 640. In one instance, the memory controller 110 can output the user data in response to a memory read request received from a computing device or system 155. If errors remain the codeword after the soft-bit ECC algorithm, the uncorrectable errors in the codeword can be reported 645.

Embodiments of the present technology advantageously improve matching between sensing conditions used for hard-bit information and sensing conditions for soft-bit information. The improved senses condition matching can advantageously improve the decoding of hard-bit and soft-bit information.

Examples

The following examples pertain to specific technology embodiments and point out specific features, elements, or steps that may be used or otherwise combined in achieving such embodiments.

In one example there is provided, a memory device comprising a Multi-Level Cell (MLC) array, a plurality of sense amplifiers, a plurality of buffers and a control logic configured to; control the plurality of sense amplifiers to sense cells of a given word line of the MLC array using a given set of sense conditions for a current one of a plurality of Soft-Bit Read (SBR) strobes, wherein latches of the sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharged during the previous HBR; control the plurality of buffers to store sense results for the current SBR strobe; determine if one or more of the cells of the given word line discharged for the current SBR strobe; and determine soft-bit information from the sense results for the plurality of SBR strobes.

In one example of a memory device, the control logic is further configured to: control the plurality of sense amplifiers to sense cells of the given word line using the given set of sense conditions for a current one of a plurality of the HBRs, wherein the given sense conditions include a discharged bit line of one or more cells that discharged during a previous HBR; control the plurality of buffers to store sense results for the current HBR; determine if one or more of the cells of the given word line discharged for the current HBR strobe; determine hard-bit information from the sense results of the plurality of HBRs.

In one example of a memory device, the plurality of HBR includes $2^n-1$ HBR levels for an n-bit MLC array.

In one example of a memory device, the plurality of SBR strobes includes 3, 5 or 7 SBR strobes for corresponding HBR levels.

In one example of a memory device, the latches of the sense amplifiers for corresponding cells are reset when the corresponding cells are not discharged during the previous SBR strobe and when the corresponding cells do not discharge during the previous HBR.

In one example of a memory device, determining the soft-bit information includes Bolean Exclusive-ORing predetermined sets of the plurality of read strobes for a plurality of read levels.

In one example of a memory device, the control logic configured to control the plurality of sense amplifiers to sense the cells of the given word line using the given set of sense conditions includes the control logic configured to: save a state of the sense amplifiers from the previous SBR strobe; reset the sense amplifiers; pre-charge bit lines for the current SBR strobe; apply a corresponding SBR strobe voltage to the given word line; control the sense amplifiers to sense the bit lines using the sense amplifiers for the current read strobe; and restore a state of one or more of the sense amplifiers with a corresponding state from a previous SBR strobe when corresponding cells discharged during the previous SBR strobe.

In one example of a memory device, the control logic configured to control the plurality of sense amplifiers to sense the cells of the given word line using the given set of sense conditions further includes: restore the state of one or more of the sense amplifiers with the corresponding state from a previous HBR level if corresponding cells discharged during the previous HBR.

In one example there is provided, a computing system comprising: a memory device including a Multi-Level Cell (MLC) array, a plurality of sense amplifiers, a plurality of buffers, and a control logic configured to; receive a soft-bit sense command; control the plurality of sense amplifiers to sense cells of a given word line of the MLC array using a given set of sense conditions for a current one of a plurality of Soft-bit Read (SBR) strobes, wherein latches of the sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharge during the previous HBR; control the plurality of buffers to store sense results for the current SBR strobe; determine if one or more of the cells of the given word line discharged for the current SBR strobe; and determine soft-bit information from the sense results for the plurality of SBR strobes; and a memory controller including, a command generator configured to receive a read request, generate the soft-bit sense commands in response to the read request, and send the soft-bit sense commands to the memory device; and an Error Correcting Code (ECC) decoder configured to receive the hard-bit information and the soft-bit information from the memory device, detect and correct errors using the hard-bit information to determine corrected read data, and detect and correct errors using the soft-bit information when one or more errors are not corrected using the hard-bit information to determine the corrected read data, and output the corrected read data.

In one example of a computing system, the control logic is further configured to: receive a hard-bit sense command; control the plurality of sense amplifiers to sense cells of the given word line using the given set of sense conditions for a current one of a plurality of the HBRs, wherein the given sense conditions include a discharged bit line of one or more cells that discharged during a previous HBR; control the plurality of buffers to store sense results for the current HBR; determine if one or more of the cells of the given word line discharged for the current HBR; determine hard-bit information from the sense results of the plurality of HBRs; and output the hard-bit information.

In one example of a computing system, the plurality of HBR includes $2^n-1$ HBR levels for an n-bit MLC array.

In one example of a computing system, the plurality of SBR strobes includes 3, 5 or 7 SBR strobes for corresponding HBR levels.

In one example of a computing system, determining the soft-bit information includes Bolean Exclusive-ORing predetermined sets of the plurality of read strobes for a plurality of read levels.

In one example of a computing system, the latches of the sense amplifiers for corresponding cells are reset when the corresponding cells are not discharged during the previous SBR strobe and when the corresponding cells do not discharge during the previous HBR.

In one example of a computing system, the ECC decoder comprises a Low-Density Parity Code (LDPC) decoder.

In one example of a computing system, the ECC decoder is further configured to output a read fail indication if one or more detected errors cannot be corrected.

In one example there is provided, a method of reading a Multi-Level Cell (MLC) memory comprising: receiving a soft-bit sense command; sensing cells of a given word line using a given set of sense conditions for a current one of a plurality of Soft-Bit Read (SBR) strobes, wherein latches of the sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharged during the previous HBR; storing the sense results for the current SBR strobe; determining if one or more of the cells of the given word line discharged for the current SBR strobe; and determining soft-bit information from the stored sense results for the plurality of read strobes.

In one example of a method of reading a Multi-Level Cell (MLC) memory, the method further comprises: receiving a hard-bit sense command; sensing cells of the given word line using the given set of sense conditions for a current one of a plurality of the HBRs, wherein the given sense conditions include a discharged bit line of one or more cells that discharged during a previous HBR; storing the sense results for the current HBR; determining if one or more of the cells of the given word line discharged for the current HBR strobe; and determining hard-bit information from the sense results of the plurality of HBRs.

In one example of a method of reading a Multi-Level Cell (MLC) memory, the plurality of HBR includes $2^n-1$ HBR levels for an n-bit MLC array.

In one example of a method of reading a Multi-Level Cell (MLC) memory, the plurality of SBR strobes includes 3, 5 or 7 SBR strobes for corresponding HBR levels.

In one example of a method of reading a Multi-Level Cell (MLC) memory, the method further comprises: decoding the hard-bit information of a codeword using a hard-bit Error Correcting Code (ECC); determining if errors in the codeword for the hard-bit information have been corrected; and outputting corrected read data when the errors in the hard-bit information of the codeword have been corrected.

In one example of a method of reading a Multi-Level Cell (MLC) memory, the method further comprises: decoding the soft-bit information of the codeword using a soft-bit information if the errors in the hard-bit information have not been corrected; determining if errors in the codeword for the soft-bit information have been corrected; and outputting corrected read data when the errors in the soft-bit information of the codeword have been corrected.

In one example of a method of reading a Multi-Level Cell (MLC) memory, the method further comprises reporting uncorrectable errors in the codeword when error in the codeword have not been corrected using the hard-bit information and the soft-bit information.

In one example of a method of reading a Multi-Level Cell (MLC) memory, the latches of the sense amplifiers for corresponding cells are reset when the corresponding cells are not discharged during the previous SBR strobe and when the corresponding cells do not discharge during the previous HBR.

In one example of a method of reading a Multi-Level Cell (MLC) memory, determining the soft-bit information includes Bolean Exclusive-ORing predetermined sets of the plurality of SBR strobes for the plurality of HBRs.

In one example of a method of reading a Multi-Level Cell (MLC) memory, sensing the cells of the given word line using the given set of sense conditions includes: saving a state of the sense amplifiers from the previous SBR strobe; resetting the sense amplifiers; pre-charging bit lines for the current SBR strobe; applying a corresponding SBR strobe voltage to the given word line; sensing the bit lines using the sense amplifiers for the current SBR strobe; and restoring a state of one or more of the sense amplifiers with a corresponding state from a previous SBR strobe when corresponding cells discharged during the previous SBR strobe.

In one example of a method of reading a Multi-Level Cell (MLC) memory, sensing the cells of the given word line using the given set of sense conditions further includes: restoring the state of one or more of the sense amplifiers with the corresponding state from a previous HBR if corresponding cells discharged during the previous HBR.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A memory device comprising a Multi-Level Cell (MLC) array, a plurality of sense amplifiers, a plurality of buffers and a control logic configured to:
control the plurality of sense amplifiers to sense cells of a given word line of the MLC array using a given set of sense conditions for a current one of a plurality of Soft-Bit Read (SBR) strobes, wherein latches of the sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharged during the previous HBR;
control the plurality of buffers to store sense results for the current SBR strobe;
determine if one or more of the cells of the given word line discharged for the current SBR strobe; and
determine soft-bit information from the sense results for the plurality of SBR strobes.

2. The memory device according to claim 1, wherein the control logic is further configured to:
control the plurality of sense amplifiers to sense cells of the given word line using the given set of sense conditions for a current one of a plurality of the HBRs, wherein the given sense conditions include a discharged bit line of one or more cells that discharged during a previous HBR;
control the plurality of buffers to store sense results for the current HBR;
determine if one or more of the cells of the given word line discharged for the current HBR;
determine hard-bit information from the sense results of the plurality of HBRs.

3. The memory device according to claim 2, wherein the plurality of HBRs includes $2^n-1$ HBR levels for an n-bit MLC array.

4. The memory device according to claim 3, wherein the plurality of SBR strobes includes 3, 5 or 7 SBR strobes for corresponding HBR levels.

5. The memory device according to claim 1, wherein the latches of the sense amplifiers for corresponding cells are reset when the corresponding cells are not discharged during the previous SBR strobe and when the corresponding cells do not discharge during the previous HBR.

6. The memory device according to claim 1, wherein determining the soft-bit information includes Boolean Exclusive-ORing predetermined sets of the plurality of read strobes for a plurality of read levels.

7. The memory device according to claim 1, wherein the control logic configured to control the plurality of sense amplifiers to sense the cells of the given word line using the given set of sense conditions includes the control logic configured to:
save a state of the sense amplifiers from the previous SBR strobe;
reset the sense amplifiers;
pre-charge bit lines for the current SBR strobe;
apply a corresponding SBR strobe voltage to the given word line;
control the sense amplifiers to sense the bit lines using the sense amplifiers for a current read strobe; and
restore a state of one or more of the sense amplifiers with a corresponding state from a previous SBR strobe when corresponding cells discharged during the previous SBR strobe.

8. The memory device according to claim 7, wherein the control logic configured to control the plurality of sense amplifiers to sense the cells of the given word line using the given set of sense conditions further includes:
restore the state of one or more of the sense amplifiers with the corresponding state from a previous HBR level if corresponding cells discharged during the previous HBR.

9. A computing system comprising:
a memory device including a Multi-Level Cell (MLC) array, a plurality of sense amplifiers, a plurality of buffers, and a control logic configured to:
receive a soft-bit sense command;
control the plurality of sense amplifiers to sense cells of a given word line of the MLC array using a given set of sense conditions for a current one of a plurality of Soft-bit Read (SBR) strobes, wherein latches of the sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharge during the previous HBR;
control the plurality of buffers to store sense results for the current SBR strobe;
determine if one or more of the cells of the given word line discharged for the current SBR strobe; and
determine soft-bit information from the sense results for the plurality of SBR strobes; and
a memory controller including,
a command generator configured to receive a read request, generate the soft-bit sense commands in response to the read request, and send the soft-bit sense commands to the memory device; and
an Error Correcting Code (ECC) decoder configured to receive hard-bit information and the soft-bit information from the memory device, detect and correct errors using the hard-bit information to determine corrected read data, and detect and correct errors using the soft-bit information when one or more errors are not corrected using the hard-bit information to determine the corrected read data, and output the corrected read data.

10. The computing system according to claim 9, wherein the control logic is further configured to:
receive a hard-bit sense command;
control the plurality of sense amplifiers to sense cells of the given word line using the given set of sense conditions for a current one of a plurality of the HBRs, wherein the given sense conditions include a discharged bit line of one or more cells that discharged during a previous HBR;
control the plurality of buffers to store sense results for the current HBR;
determine if one or more of the cells of the given word line discharged for the current HBR;
determine hard-bit information from the sense results of the plurality of HBRs; and
output the hard-bit information.

11. The computing system according to claim 10, wherein the plurality of HBRs includes $2^n-1$ HBR levels for an n-bit MLC array.

12. The computing system according to claim 11, wherein the plurality of SBR strobes includes 3, 5 or 7 SBR strobes for corresponding HBR levels.

13. The computing system according to claim 9, wherein determining the soft-bit information includes Boolean Exclusive-ORing predetermined sets of the plurality of read strobes for a plurality of read levels.

14. The computing system according to claim 9, wherein the latches of the sense amplifiers for corresponding cells are reset when the corresponding cells are not discharged during the previous SBR strobe and when the corresponding cells do not discharge during the previous HBR.

15. The computing system according to claim 9, wherein the ECC decoder comprises a Low-Density Parity Code (LDPC) decoder.

16. The computing system according to claim 9, wherein the ECC decoder is further configured to output a read fail indication if one or more detected errors cannot be corrected.

17. A method of reading a Multi-Level Cell (MLC) memory comprising:
receiving a soft-bit sense command;
sensing cells of a given word line using a given set of sense conditions for a current one of a plurality of Soft-Bit Read (SBR) strobes, wherein latches of sense amplifiers for corresponding cells are loaded with sense results of the previous SBR strobe when the corresponding cells discharged during a previous SBR strobe or are loaded with sense results of a previous Hard-Bit Read (HBR) when the corresponding cells discharged during the previous HBR;
storing sense results for the current SBR strobe;
determining if one or more of the cells of the given word line discharged for the current SBR strobe; and
determining soft-bit information from the stored sense results for the plurality of read strobes.

18. The method according to claim 17, further comprising:
receiving a hard-bit sense command;
sensing cells of the given word line using the given set of sense conditions for a current one of a plurality of the HBRs, wherein the given sense conditions include a discharged bit line of one or more cells that discharged during a previous HBR;
storing the sense results for the current HBR;
determining if one or more of the cells of the given word line discharged for the current HBR; and
determining hard-bit information from the sense results of the plurality of HBRs.

19. The method according to claim 18, wherein the plurality of HBRs includes $2^n-1$ HBR levels for an n-bit MLC array.

20. The method according to claim 19, wherein the plurality of SBR strobes includes 3, 5 or 7 SBR strobes for corresponding HBR levels.

21. The method according to claim 18, further comprising:
decoding the hard-bit information of a codeword using a hard-bit Error Correcting Code (ECC);
determining if errors in the codeword for the hard-bit information have been corrected; and
outputting corrected read data when the errors in the hard-bit information of the codeword have been corrected.

22. The method according to claim 21, further comprising:
decoding the soft-bit information of the codeword using a soft-bit information if the errors in the hard-bit information have not been corrected;
determining if errors in the codeword for the soft-bit information have been corrected; and
outputting corrected read data when the errors in the soft-bit information of the codeword have been corrected.

23. The method according to claim 22, further comprising reporting uncorrectable errors in the codeword when error in the codeword have not been corrected using the hard-bit information and the soft-bit information.

24. The method according to claim 17, wherein the latches of the sense amplifiers for corresponding cells are reset when the corresponding cells are not discharged during the previous SBR strobe and when the corresponding cells do not discharge during the previous HBR.

25. The method according to claim 18, wherein determining the soft-bit information includes Bolean Exclusive-ORing predetermined sets of the plurality of SBR strobes for the plurality of HBRs.

26. The method according to claim 17, wherein sensing the cells of the given word line using the given set of sense conditions includes:
saving a state of the sense amplifiers from the previous SBR strobe;
resetting the sense amplifiers;
pre-charging bit lines for the current SBR strobe;
applying a corresponding SBR strobe voltage to the given word line;
sensing the bit lines using the sense amplifiers for the current SBR strobe; and
restoring a state of one or more of the sense amplifiers with a corresponding state from a previous SBR strobe when corresponding cells discharged during the previous SBR strobe.

27. The method according to claim 23, wherein sensing the cells of the given word line using the given set of sense conditions further includes:
restoring a state of one or more of the sense amplifiers with a corresponding state from a previous HBR if corresponding cells discharged during the previous HBR.

* * * * *